United States Patent [19]
Larson

[11] Patent Number: 4,682,149
[45] Date of Patent: Jul. 21, 1987

[54] HIGH RESOLUTION PIPELINED DIGITAL-TO-ANALOG CONVERTER

[75] Inventor: Lawrence E. Larson, Los Angeles, Calif.

[73] Assignee: Hughes Aircraft Company, Los Angeles, Calif.

[21] Appl. No.: 782,777

[22] Filed: Oct. 2, 1985

[51] Int. Cl.[4] .............................................. H03M 1/72
[52] U.S. Cl. ........................ 340/347 DA; 340/347 M; 340/347 NT
[58] Field of Search ................. 340/347 DA, 347 CC, 340/347 C, 347 M, 347 NT

[56] References Cited

U.S. PATENT DOCUMENTS

| | | | |
|---|---|---|---|
| 3,541,446 | 11/1970 | Prozeller | 340/347 NT X |
| 3,972,034 | 7/1976 | Derickson, III et al. | 365/219 |
| 4,375,059 | 2/1983 | Schlig | 340/347 M X |
| 4,529,965 | 7/1985 | Lee | 363/59 X |

OTHER PUBLICATIONS

McCharles et al., Charge Circuits for Analog LSI, reprinted from: IEEE Transactions Circuits and Systems, vol. CAS-25, 7/1978, pp. 490–497.

Primary Examiner—T. J. Sloyan
Attorney, Agent, or Firm—Michael W. Sales; Anthony W. Karambelas

[57] ABSTRACT

A high resolution pipelined digital-to-analog converter is disclosed having at least one switching circuit for conveying charge to at least one conversion capacitor upon receipt of a digital signal during the first half of a clock cycle. Additional switching circuits are provided for transferring the charge from the conversion capacitors to a feedback capacitor during the second half of the clock cycle. Also provided is a circuit for discharging an analog output from, and preventing the charging of, the feedback capacitor during the first half of a succeeding clock cycle. In a preferred embodiment, the pipelined digital-to-analog converter comprises a first plurality of electrical circuits having at least one feedback capacitor and a plurality of conversion capacitors adapted for accepting digital and analog inputs, wherein the ratio of the feedback capacitance to each of the conversion capacitances is substantially independent of the resolution of the converter. A second plurality of electrical circuits is also provided which is operable to delay at least one bit of the digital signal to one of the first plurality of electrical circuits. The digital-to-analog converter is operable to allow the number of n-bit digital words converted by the converter to be independent of the resolution of the converter.

15 Claims, 3 Drawing Figures

HIGH RESOLUTION PIPELINED DIGITAL-TO-ANALOG CONVERTER

BACKGROUND OF THE INVENTION

1. Field of the Invention

This invention relates to the field of converting digital signals to analog representation and, more particularly, to high resolution pipelined digital-to-analog converters.

2. Description of Related Art

A wide variety of analog devices are often controlled by digital computers, examples of which include various types of analog positioning devices which may be part of systems designed to control missile steerage and speed. To interface these devices with digital computers, circuits known as digital-to-analog converters have been developed which can provide an analog output voltage dependent on the value of a digital input signal from the computer. The output voltage of an n-bit digital-to-analog converter can typically be represented as:

$$V_{out} = V_{ref}(b_0 2^{-n} + b_1 2^{-(n-1)} + b_2 2^{-(n-2)} + \ldots + b_{n-1} 2^{-1})$$

where $V_{out}$ is the output voltage of the converter, $V_{ref}$ is a reference voltage applied to the converter, and $b_o - b_1 \ldots -b_{n-1}$ is the digital input signal delivered to the converter where $b_o$ represents the least significant bit and $b_{n-1}$ is the most significant bit.

Many digital-to-analog converters are essentially voltage divider networks having each bit driving a weighted resistor to produce the desired output voltage. Other digital-to-analog converters use an R-2R resistive ladder, in which resistors of two values are arranged in a ladder network to produce an analog output signal. Because resistors fabricated from polysilicon or by diffusion are inherently large and non-linear with respect to voltage, the preferred practice in MOS (metal oxide semiconductor) technology is to use capacitive elements in integrated digital-to-analog converters. Such capacitors are typically constructed by placing a metal or polysilicon electrode over a thin insulating layer on the surface of a doped region of the silicon substrate or on the surface of a second polysilicon layer. By using binary weighted conversion capacitors and fedback capacitors of this type, in conjunction with field-effect transistors, digital-to-analog converters can be fabricated relatively simply.

While digital-to-analog converters using binary weighted capacitors can be fabricated using MOS technology as described above, their utility often becomes limited as the desired resolution (i.e., the number of bits to be converted) increases. Since each bit generally requires a weighted conversion capacitor having a value equal to twice that of the next least significant bit, the ratio of the feedback capacitance to that of the conversion capacitor associated with the least significant bit doubles for each one bit increase in resolution. This doubling of the capacitance ratio may inherently reduce the accuracy of conversion by a statistically determined quantity and has generally limited resolution of MOS converters to approximately 8 bits in actual practice.

In addition, the digital-to-analog converters fabricated using MOS are not generally pipelined (i.e., unable to operate on more than one word simultaneously) thus limiting throughput. Though relatively fast converters exist in other technologies, a number of difficulties have emerged in attempting to implement pipelined converters using MOS fabrication techniques. In addition to requiring resistors having the disadvantages described above, the energy dissipated by these converters is generally relatively large and hence, unsuitable for MOS implementation.

SUMMARY OF THE INVENTION

It is therefore a primary purpose of the present invention to provide a high speed digital-to-analog converter which may be pipelined. A related purpose of the present invention is to provide a digital-to-analog converter in which the ratio of the feedback capacitance to that of the conversion capacitors remains substantially constant while resolution increases.

It is further purpose of the present invention to provide a digital-to-analog converter which may be used in applications where high resolution is required.

It is also a purpose of the present invention to provide an integrated digital-to-analog converter in which the accuracy of conversion remains high as the resolution increases.

These and other objects of the invention are accomplished by providing a digital-to-analog converter comprising a first switching means for charging a first capacitor upon receipt of a digital signal during the first half of a clock cycle. Second switching means is further provided for transferring the charge from the first capacitor to a second capacitor during the second half of the clock cycle. Also provided is a means for discharging and preventing the charging of the second capacitor during the first half of the succeeding clock cycle, such discharge constituting the analog output. Further provided is a plurality of such converters and flip-flops so adapted as to allow pipelining of succesive multibit digital words.

BRIEF DESCRIPTION OF THE DRAWNGS

The various advantages of the present invention will become apparent to one skilled in the art upon reading the following specifications and by reference to the drawings in which.

DESCRIPTION OF THE PREFERRED EMBODIMENT

Figure 1:
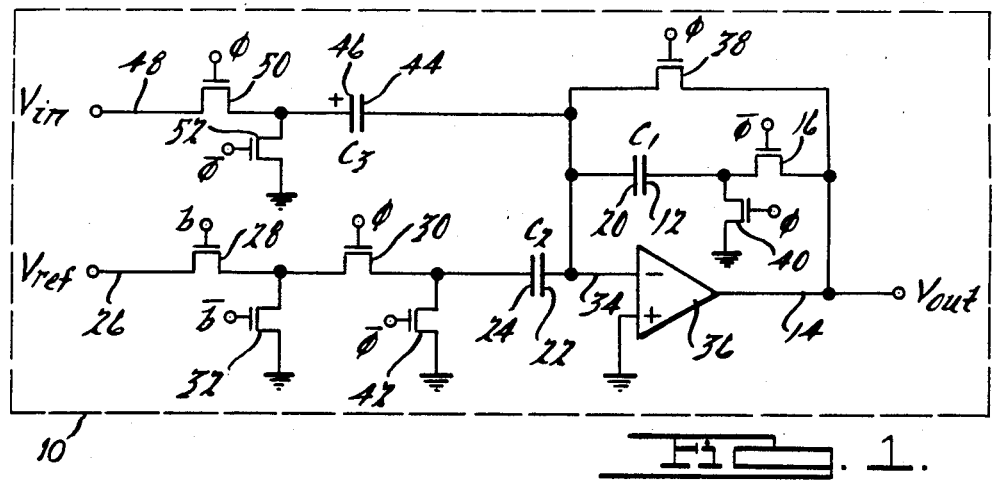
FIG. 1 illustrates a circuit capable of simultaneously converting a one-bit digital signal and an analog signal into an analog representation which is able to be pipelined.
Figure 2:
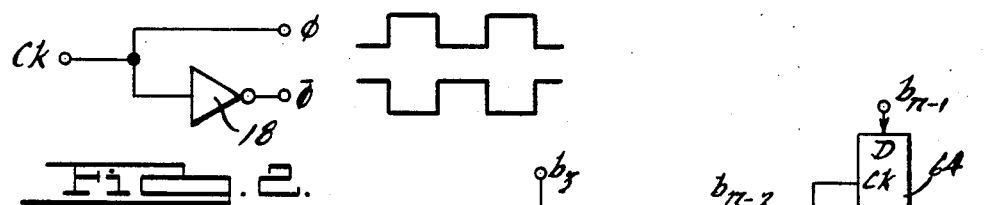
FIG. 2 is a timing diagram for the clock used in conjunction with the circuit of Fig. 1.

Referring to FIG. 1, to convert a one-bit digital word into an analog representation, a one-bit digital-to-analog converter 10 is provided which has an analog voltage output terminal 14 coupled to a feedback capacitor C1 through an analog switch 16. As illustrated in FIG. 2, the converter 10 is supplied wth a suitable means such as inverter 18 for generating from a master clock generator (not shown), two clock pulse trains $\Phi$ (during the first half of the clock cycle) and $\overline{\Phi}$ (during the last half of the clock cycle) from a master clock generator (not shown). The analog switch 16 in the preferred embodiment is an enhancement mode MOS n-channel field-effect transistor, and is closed upon receipt of an enabling $\overline{\Phi}$ signal which is generated during the second half of the clock period or cycle. An output voltage $V_{out}$ at the output terminal 14 of the converter 10 is delivered during the next Φ cycle and is related to the capacitance of the capacitor $C_1$ and the charge stored thereon according to the following approximate relationship:

$$V_{out} = Q_1/C1$$

where C1 is the capacitance of the capacitor $C_1$ measured in farads, and $Q_1$ is the charge on the capacitor in coulombs. Typically, the capacitance of capacitor $C_1$ is relatively low (e.g., approximatley 1 picofarad) in applications where speed is the primary concern so that charging time can be minimized. When high resolution is also important, the value of capacitor $C_1$ is somewhat larger (i.e., approximately 5 picofarads) to reduce random edge and random oxide effects occurring when the plate area of the capacitor is relatively small with respect to its perimeter.

The feedback capacitor $C_1$ derives its charge from conversion capacitor $C_2$ and as will be discussed later, from conversion capacitor $C_3$.

To deliver charge to the capacitor $C_1$, the second plate 20 of the capacitor $C_1$ is connected to the first plate 22 of a conversion capacitor $C_2$. The capacitor $C_2$ is used to initially store a charge during the first half of the clock cycle, which is then transferred to the capacitor $C_1$ during the second half of the clock cycle. The capacitor $C_2$ is charged by creating a voltage drop across its plates, and has a capacitance of approximately half that of the capacitor $C_1$ so as to generate an appropriate transfer function as discussed subsequently.

To place a positive voltage on the second plate 24 of the capacitor $C_2$ during the first half of the clock cycle, the second plate 24 is connected to a reference voltage terminal 26 of the converter 10 by analog switches 28 and 30. As with the other analog switches of the converter 10 (e.g., switch 16), the analog switches 28 and 30 are enhancement mode MOS n-channel field-effect transistors. When a high logic level for a given bit position b is received by the converter 10 from a digital computer (not shown), the analog switch 28 connects the analog switch 30 to the reference voltage terminal 26 which is at a potential of $V_{ref}$. When an enabling Φ signal is received by the analog switch 30 during the first half of the clock cycle, the switch 30 connects the reference voltage terminal 26 to the second plate 24 of the capacitor $C_2$, the potential of which increases to $V_{ref}$. To prevent the node between the analog switches 28 and 30 from floating, an analog switch 32 is provided which couples this node to ground upon receipt of a low logic level for bit position b.

To ground the first plate 22 of the capacitor $C_2$ during the first portion of the clock cycle, the first plate 22 is further connected to the inverting terminal 34 of an operational amplifier 36. While in the preferred embodiment, the operational amplifier 36 is a folded cascade operational amplifier, it is to be understood that other types of operational amplifiers may be used. The first plate 22 is also connected through a switch 38 to the output terminal 14, which serves to deliver the output of the operational amplifier 36. Because of the low output impedance of the operational amplifier 36, the output terminal 14 of the operational amplifier 36 is grounded which grounds the first plate 22 of the capacitor $C_2$ and the second plate 20 of the capacitor $C_1$. The first plate 12 of the capacitor $C_1$ is also grounded during the first half of the clock cycle by the actuation of an analog switch 40. In addition to supplying the analog output voltage $V_{out}$ during the first half of the succeeding clock cycle, the capacitor $C_1$ provides the desired dominant pole compensation for the operational amplifier 36 to ensure proper operation. Further, the arrangement of $C_1$ and $C_2$ eliminates the effect the offset voltage of the operational amplifier 36 would otherwise have on the operation of the converter 10. While the operational amplifier 36 and the analog switch 40 discharge and prevent the charging of the capacitor $C_1$ during the first half of the clock cycle, it is to be understood that any other means for discharging and preventing the charging of the capacitor $C_1$ during the first half of the clock cycle can also be used.

To transfer the charge on the capacitor $C_2$ to the capacitor $C_1$ during the second half of the clock cycle, an analog switch 42 is used to couple the second plate 24 of the capacitor $C_2$ to ground upon receipt of an enabling $\overline{\Phi}$ signal. When the second plate 24 of the capacitor $C_2$ is connected to ground through the switch 42, the charge stored on the capacitor $C_2$ is dissipated by current flowing from the terminal 14 of the operational amplifier 36 through the analog switch 16 and the capacitor $C_1$ to the capacitor $C_2$. Since the current flowing through the capacitors $C_1$ and $C_2$ is the same, the charge on the capacitor $C_1$ induced by the current is equivalent to the dissipated charge on capacitor $C_2$. This charge on the capacitor $C_1$ causes a voltage to be developed across its plates equal to (C2) ($V_{ref}$/C1), or $V_{ref}/2$, as the capacitance of the capacitor $C_1$ is chosen to be twice that of the capacitor $C_2$. This voltage is applied to the output terminal 14 by the analog switch 16.

To allow the converter 10 to be pipelined, an additional feed-in capacitor $C_3$ is used. The first plate 44 of the feed-in capacitor $C_3$ is connected to the second plate 20 of the capacitor $C_1$ and the second plate 46 of $C_3$ is connected to the analog input terminal 48 of the converter 10 through an analog switch 50. The analog input terminal 48 is used to receive an analog signal $V_{in}$ from a substantially identical upstream converter (not shown). When actuated during the first half of the clock cycle upon receipt of an enabling Φ signal, the analog switch 50 connects the analog input terminal 48 of the converter 10 to the second plate 46 of the capacitor $C_3$ which increases the potential at the plate 46 to $V_{in}$. Because the first plate 44 of the capacitor $C_3$ is grounded during the first half of the clock cycle by means of the operational amplifier 36, the charge on the capacitor $C_3$ is equal to $Q_3 = (C3)(V_{in})$, where C3 is the capacitance of the capacitor $C_3$ and is chosen to be half that of the capacitor $C_1$.

To transfer the charge on the capacitor $C_3$ to the capacitor $C_1$ during the second half of the clock cycle, an analog switch 52 is located between the second plate 46 of the capacitor $C_3$ and ground. When the analog switch 52 is actuated upon receipt of an enabling $\overline{\Phi}$ signal, the charge stored on the capacitor $C_3$ is dissipated by current flowing from the terminal 14 of the operational amplifier 36 through the analog switch 16 and the capacitor $C_1$ to the capacitor $C_3$. Since the current flowing through the capacitors $C_1$ and $C_3$ is the same, the charge on the capacitor $C_1$ induced by the current is equivalent to the dissipated charge on the capacitor $C_3$. Because both the capacitors $C_2$ and $C_3$ cause charge to be induced on the capacitor $C_1$, the voltage at the first plate 12 of the capacitor $C_1$ is equal to:

$$V_{out} = \frac{Q_2 + Q_3}{C_1}$$

Since the values of capacitors $C_2$ and $C_3$ are chosen to be half that of the capacitor $C_1$, the converter is able to produce the following transfer function:

$$V_{out} = \frac{(bV_{ref})}{2} + \frac{V_{in})Z^{-\frac{1}{2}}}{2}$$

where $Z^{-\frac{1}{2}}$ indicates that the output signal appears one-half of a clock cycle after the input is applied to the converter. Importantly, the ratio of feedback capacitance to that of the conversion capacitor is low and remains constant as resolution increases, so that the accuracy of conversion remains high as words exceeding 8 bits in length are converted.

Figure 3:
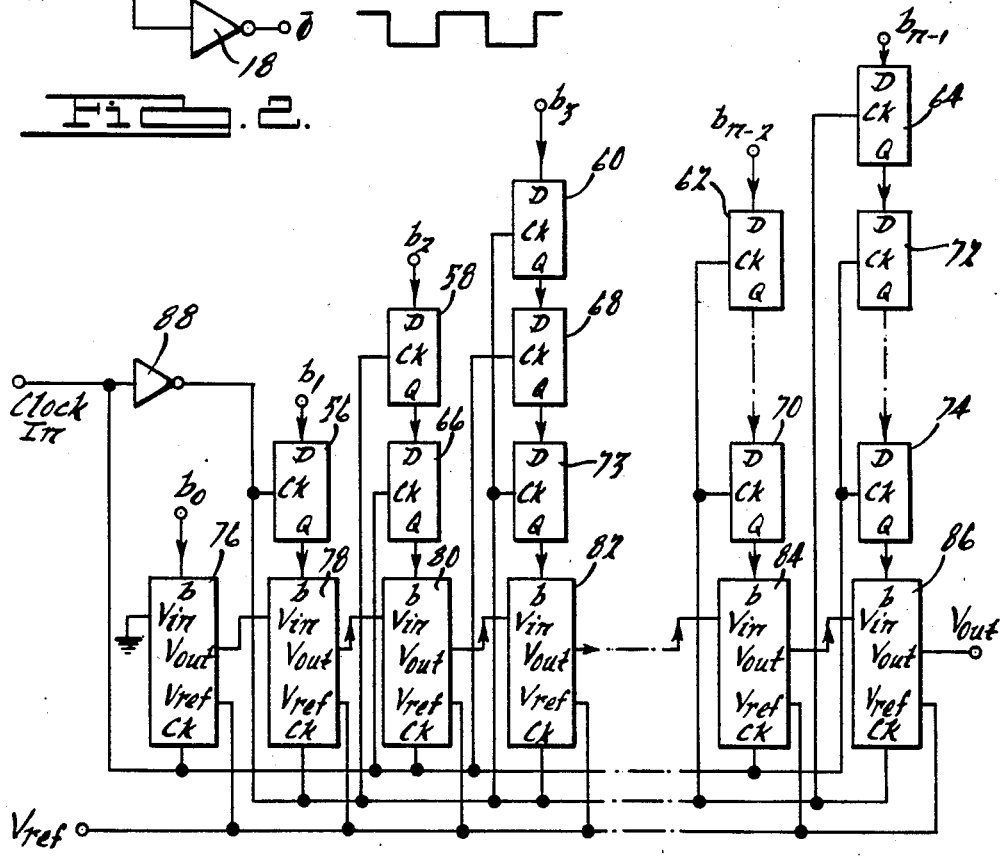
FIG. 3 illustrates a pipelined, multiple-bit digital-to-analog converter using a plurality of the circuits of FIG. 1.

To accomplish pipelining and to combine the conversion of multiple bits of a digital word into a single analog output, a plurality of shift registers composed of D-flip-flops 56-74 are connected to a plurality of one-bit converters 78-86 as shown in FIG. 3. The D-flip-flops 56-74 are used to delay delivery of the bits $b_1 - b_{n-1}$ to the converter 78 and to the flip-flops 66-72 by one-half of a clock cycle. The D-flip-flops 56-74 are connected directly to a clock generator (not shown) or to an inverter 88 which is connected to the clock generator.

In operation, the digital bits $b_0 - b_{n-1}$ are applied simultaneously to the one-bit converter 76 and the D-flip-flops 56-64, respectively, over successive clock cycles. During the first half of the first clock cycle, the processing of bit $b_o$ by the converter 76 begins while the bits $b_1 - b_{n-1}$ are delayed by D-flip-flops 56-64 for one-half of the first clock cycle. During the first half of the succeeding clock cycle, the analog representation of bit $b_o$ is delivered to the converter 78 for the processing as $V_{in}$, while $b_1$ is simultaneously delivered by the D-flip-flop 56. In addition, the bits $b_2 - b_{n-1}$ are transferred to the next D-flip-flops 66-72 in their respective shift registers for another one-half clock cycle. Also, during the first half of the next clock cycle, another word having new bits $b_o - b_{n-1}$ is applied to the converter 76 and the D-flip-flops 56-64, respectively. Simultaneously, the analog representation of the bits $b_o$ and $b_1$ of the first word generated by the converter 78 is also applied to the input of the converter 80, and is later combined with the analog representation of bit $b_2$ during the subsequent half clock cycle. This process continues until bit $b_{n-1}$ is combined with the previous bits to produce an analog representation of the n-bit word of the following form:

$$V_{out} = V_{ref}(b_0 2^{-n} + b_1 2^{-(n-1)} + b_2 2^{-(n-2)} + \ldots + b_{n-2} 2^{-2} + b_{n-1} 2^{-1})Z^{-n/2}$$

The analog representation of the n-bit word is therefore available in n/2 clock cycles, and successive digital words are provided to the converter 76 and D-flip-flops 56-64 at the beginning of each clock cycle.

It should be understood that while the present invention was described in connection with one specific embodiment, other modifications will become apparent to one skilled in the art upon a study of the specification, drawings and following claims.

What is claimed is:

1. A device for converting a digital signal into an analog representation, the device having a one-bit digital-to-analog converter responsive to a clock signal having successive first and second portions, the one-bit converter comprising:

(a) a first capacitor;
    (b) first switching means for charging the first capacitor upon receipt of the digital signal during the first portion of said clock signal;
    (c) a second capacitor
    (d) second switching means for charging said second capacitor during said first portion of said clock signal upon receipt of an analog from another of said devices;
    (e) a third capacitor having substantially twice the capacitance of said first and second capacitors;
    (f) third switching means for transferring the charge from the first and second capacitors to the third capacitor during the second portion of said clock signal; and
    (g) isolating means for discharging and preventing the charging of the third capacitor during the succeeding first portions of said clock signal whereby the third capacitor responsively discharges an analog signal output during succeeding second portions of said clock signal.

2. The device of claim 1, wherein the isolating means comprises an analog switch operable to ground a first plate of the third capacitor during the first portion of said clock signal and an operational amplifier operable to ground a second plate of the third capacitor during the first portion of said clock signal.

3. The device of claim 2, wherein the first switching means comprises a first transistor for coupling a reference voltage to a second transistor upon receipt of a digital signal of a given logic level, and the second transistor is for coupling the reference voltage to the first capacitor during the first portion of said clock signal.

4. The device of claim 3, wherein the third switching means comprises a third transistor for selectively coupling the node between the first and second transistors to ground, and the third switching means further comprises a fourth transistor for coupling the first capacitor to ground during the second portion of said clock signal.

5. The device of claim 4, wherein the second switching means comprises a fifth transistor for coupling the output from another of said device to the second capacitor during the first portion of said clock signal, and the second switching means further comprises a sixth transistor for coupling the third capacitor to ground during the second portion of said clock signal.

6. The device of claim 5 wherein the third switching means further comprises a seventh transistor for delivering the output from the second capacitor to said third capacitor during the succeeding second portions of said clock signal.

7. The device of claim 6 wherein the first and second portions of said clock signal are equal in duration.

8. The device of claim 3 further including at least one shift register for delaying particular bits of successive multi-bit digital signals to at least one such one-bit converter to allow a plurality of such one-bit digital-to-analog converters to be pipelined.

9. A pipelined digital-to-analog converter for converting successive multibit digital signals into an analog output within a predetermined number of half clock cycles comprising:

(a) a first plurality of electrical circuits for converting multibit digital signals into an analog output having a plurality of conversion capacitors for receiving digital bit inputs and pipelined analog outputs and at least one feedback capacitor for discharging a responsive analog output, said feedback capacitor having substantially twice the capacitance than said conversion capacitors, wherein the ratio of the feedback capacitance to each of the conversion capacitances is constant and substantially independent of the resolution of the converter, said feedback capacitor electrically communicating with isolation means for discharging and preventing the charging of said feedback capacitor during one of said half clock cycles, said isolation means comprising an operational amplifier electrically communicating with said feedback capacitor, said isolation means further comprising an analog switch for selectively grounding one plate of said feedback capacitor; and (b) a second plurality of electrical circuits operable to selectively delay delivery of such successive multibit digital signals to the first plurality of electrical circuits by a predetermined number of half clock cycles.

10. The pipelined digital-to-analog converter of claim 9, wherein each of the first plurality of electrical circuits is adapted to responsively discharge an analog output in a clock cycle, and the second plurality of circuits comprises a plurality of D-flip-flops each operable to delay delivery of successive digital bits of each multibit digital signal to one of the first plurality of electrical circuits by one-half of the clock cycle.

11. The pipelined digital-to-analog converter of claim 9, wherein the first and second plurality of electrical circuits are operable to allow conversion of an n-bit digital signal in n/2 clock cycles.

12. A pipelined digital-to-analog converter for converting successive multiple-bit digital signals into analog signals in predetermined number of successive two part predetermined clock cycles, said digital-to-analog converter comprising:

(a) a first plurality of electrical circuits each operable to convert a one-bit digital signal into an analog signal, at least one of the first plurality of electrical circuits comprising:
  (i) a first capacitor;
  (ii) first switching means for charging the first capacitor upon receipt of the one-bit digital signal during the first part of a clock cycle,
  (iii) a second capacitor;
  (iv) second switching means for charging the second capacitor during the first part of the clock cycle upon receipt of an analog signal from another of said first plurality of electrical circuits;
  (v) a third capacitor having substantially twice the capacitance of said first and second capacitors;
  (vi) third switching means for transferring the charge from the first and second capacitors to the third capacitor during the second part of the clock cycle;
  (vii) isolating means for discharging and preventing the charging of the third capacitor during the first part of the succeeding clock cycle whereby the third capacitor responsively discharges an analog signal output during the first part of the succeeding clock cycle and delivers it to another of said first plurality of electrical circuits; and (b) a second plurality of electrical circuits operable to successively delay delivery of at least one digital bit of each multiple-bit digital signal to at least one of the first plurality of electrical circuits by a predetermined number of part clock cycles thereby allowing said digital-to-analog converter to be pipelined.

13. The digital-to-analog converter of claim 12, wherein the second plurality of electrical circuits successively delays delivery of successive digital bits in multiple-bit digital signals to the first plurality of electrical circuits by one-half of the clock cycle, and the first and second part of the clock cycle are each equal to one-half of the clock cycle.

14. The digital-to-analog converter of claim 12, wherein the first and second plurality of electrical circuits are adapted to convert an n-bit digital signal to analog representation in n/2 clock cycles.

15. The digital-to-analog converter of claim 12, wherein at least one of the second plurality of electrical circuits comprises a predetermined number of D-flip-flops connected in series, such number being equal to the predetermined number of half clock cycles the associated bit is to be successively delayed.

* * * * *